United States Patent
Xue et al.

(10) Patent No.: US 9,052,540 B2
(45) Date of Patent: Jun. 9, 2015

(54) ARRAY SUBSTRATE AND LIQUID CRYSTAL DISPLAY PANEL

(71) Applicant: Shenzhen China Star Optoelectronics Technology Co., Ltd., Shenzhen, Guangdong (CN)

(72) Inventors: Jingfeng Xue, Shenzhen (CN); Je-hao Hsu, Shenzhen (CN); Xiaohui Yao, Shenzhen (CN)

(73) Assignee: Shenzhen China Star Optoelectronics Technology Co., Ltd, Shenzhen, Guangdong ( * ) Notice: Subject to any disclaimer, the term of this patent is extended or adjusted under 35 U.S.C. 154(b) by 0 days.

(21) Appl. No.: 14/233,879

(22) PCT Filed: Aug. 7, 2013

(86) PCT No.: PCT/CN2013/080976
§ 371 (c)(1),
(2) Date: Jan. 20, 2014

(87) PCT Pub. No.: WO2015/010348
PCT Pub. Date: Jan. 29, 2015

(65) Prior Publication Data
US 2015/0036069 A1 Feb. 5, 2015

(30) Foreign Application Priority Data
Jul. 26, 2013 (CN) .......................... 2013 1 0320358

(51) Int. Cl.
G02F 1/133 (2006.01)
H01L 27/12 (2006.01)
G02F 1/1343 (2006.01)
G02F 1/1362 (2006.01)
G02F 1/1368 (2006.01)

(52) U.S. Cl.
CPC ........ *G02F 1/13306* (2013.01); *G02F 1/13439* (2013.01); *G02F 1/136209* (2013.01); *G02F 1/136213* (2013.01); *G02F 1/136286* (2013.01); *G02F 1/1368* (2013.01); *G02F 2001/136222* (2013.01); *H01L 27/124* (2013.01); *H01L 27/1255* (2013.01)

(58) Field of Classification Search
CPC .......... G02F 1/13306; G02F 1/136213; G02F 1/1368; G02F 1/136286; G02F 1/136209; G02F 1/13439; H01L 27/124
See application file for complete search history.

(56) References Cited

U.S. PATENT DOCUMENTS

| | | | |
|---|---|---|---|
| 2012/0274748 A1* | 11/2012 | Hwang et al. | 348/51 |
| 2013/0135365 A1* | 5/2013 | Ito | 345/690 |
| 2013/0147863 A1* | 6/2013 | Kim et al. | 345/691 |
| 2013/0250204 A1* | 9/2013 | Seki et al. | 349/58 |
| 2014/0016075 A1* | 1/2014 | Iwata et al. | 349/141 |
| 2014/0210872 A1* | 7/2014 | Sasaki | 345/690 |

* cited by examiner

Primary Examiner — Andrew Sasinowski
(74) Attorney, Agent, or Firm — Andrew C. Cheng

(57) ABSTRACT

The present invention provides an array substrate and a liquid crystal display panel. Wherein, in the array substrate, each pixel unit comprises a first pixel electrode, a second pixel electrode, and a third pixel electrode. And each pixel unit comprises a first control circuit and a second control circuit. The first control circuit affects the first pixel electrode, so that the first pixel electrode is under the state of displaying the image corresponding to the black screen in the 3D display mode. The second control circuit affects the second pixel electrode and the third pixel electrode to change the voltage difference between the second pixel electrode and the third pixel electrode. By the above way, the present invention can minimize the color difference in wide viewing angle, improve the opening ratio in the 2D display mode, and reduce the crosstalk of the two eyes signal in the 3D display mode. Furthermore, it can reduce the amount of the data drivers and reduce the costs.

16 Claims, 6 Drawing Sheets

US 9,052,540 B2

ARRAY SUBSTRATE AND LIQUID CRYSTAL DISPLAY PANEL

BACKGROUND OF THE INVENTION

1. Field of the Invention

The present invention relates to the field of liquid crystal display techniques, and in particular to an array substrate and a liquid crystal display panel.

2. The Related Arts

VA (Vertical Alignment) liquid crystal display panel has the advantages of fast response, high contrast ratio, etc., which is the mainstream development of the present liquid crystal display panel. However, in the different perspective, the alignment direction of the liquid crystal molecules is different, which also makes the effective refractive index of the liquid crystal molecules different. Therefore, it causes the changes of transmitted light intensity. The concrete manifestation is reduction of transmittance ability in oblique angle. The colors in the directions of the oblique angle and the center angle are different, causing the color difference. Therefore, it can be observed the color distortion in wide angle. In order to improve the color distortion in wide angle, in the pixel design, it divides a pixel to a main pixel region and a sub pixel region. Each pixel region is divided to 4 domains (domain means the small region which the directions of the liquid crystal molecules are substantially the same), and each pixel is divided to 8 domains. By controlling the voltage difference between the main pixel region and the sub pixel region, it makes the arrangements of liquid crystal molecules between two pixel regions different, further improving the color distortion in the wide angle, and achieving the effect of low color shift (LCS).

In the 3D FRR (Film-type Patterned Retarder) stereoscopic display technology, the both adjacent rows pixels respectively correspond to the observer's left eye and right eye, in order to respectively generate the left-eye image corresponding to the left eye and the right-eye image corresponding to the right eye. After the observer's left and right eyes respectively receive the corresponding left-eye image and right-eye image, it makes the observer feel the stereoscopic display effect through the brain combining the left-eye and right-eye images. However, the left-eye and right-eye images are easy to occur crosstalk, which causes the observer to see overlapping images, affecting the viewing experience. In order to avoid the left-eye and right-eye images occurring crosstalk, it adds a light shield region (Black Matrix, BM) between two adjacent rows of pixels to avoid the crosstalk signals, which reduces the eyes signal crosstalk. However, this way will result the reduction of the opening ratio in the 2D display mode and lower the display brightness in the 2D display mode.

In the LCS design described as above, the technical solution, which divides a pixel to a main pixel region and a sub pixel region, can simultaneously solve the opening ratio in the 2D display mode and the two-eye signal crosstalk issue in the 3D display mode, that is, control both the main pixel region and the sub pixel region normally display 2D screen in the 2D display mode. And, make the main pixel region display the dark screen in order to be equivalent to BM in the 3D display mode, which is used to reducing the two-eye signal crosstalk, making the sub pixel region normally display the 3D image. However, in 3D display mode, because the main pixel region displays the dark screen, there is only one sub pixel region normally displaying 3D image in the 3D display mode, which can not achieve the effect of LCS and the color distortion in wide angle can still be observed.

In order to solve the above issue, referring to FIGS. 1 and 2, in the prior art, it divides a pixel into three sub pixel regions A, B, C. Each sub pixel region is divided to 4 domains. Each pixel adopts two data lines and two scanning lines to drive. In the 2D display mode, it simultaneously controls the thin film transistor 1, 2, 3 to turn on through the GateN_1. The DataN_1 inputs the corresponding data signal to the sub pixel region A, and the DataN_2 inputs the corresponding data signal to the sub pixel B and sub pixel C, so that the three sub pixel regions A, B, C can normally display 2D screen. Therefore, it can increase the opening in the 2D display mode, and it can respectively input the different data signals to the sub pixel region A, sub pixel region B and sub pixel region C through the DataN_1 and DataN_2, so that the voltages of the sub pixel region A, sub pixel region B and sub pixel region C are different. Then, it controls the thin film transistor 4 to turn on through the GateN_2, which makes the voltages of the sub pixel region B and sub pixel region C different under the effect of capacitor C1, further achieving the LCS effect in the 2D display mode. In the 3D display mode, it simultaneously controls the thin film transistors 1, 2, 3 to turn on through the GateN_1. The DataN_1 inputs the corresponding data signal to the sub pixel region A, so that the sub pixel region A displays black screen. The DataN_2 inputs the corresponding data signal to the sub pixel region B and the sub pixel region C, so that the sub pixel region B and the sub pixel region C display 3D image. Thereby, in the two adjacent rows of pixels, there is a sub pixel region A which displays black screen between the sub pixel region B and the sub pixel region C displaying the left-eye image in one row pixel and the sub pixel region B and the sub pixel region C displaying the right-eye image in the other row pixel. The sub pixel region A which displays black screen is equivalent to BM, thus reducing the 3D eyes signal crosstalk. After then, turning on the thin film 4 through the GateN_2, which makes the voltages of the sub pixel region B and the sub pixel region C different under the effect of the capacitor 5, achieving the LCS effect in the 3D display mode.

Through the above technical solution, it can solve problems of the opening ratio in the 2D display mode and the eyes signal crosstalk issue in the 3D display mode. It also can simultaneously achieve the LCS effect in the 2D display mode and the 3D display mode. However, in the above technical solution, each pixel needs two data lines to drive, which correspondingly increases the number of data drivers and is not conducive to cost reduction.

SUMMARY OF THE INVENTION

The technical issue to be solved by the present invention is to provide an array substrate and a liquid crystal display panel, which can reduce the color difference in wide viewing angle, increase the opening in 2D display mode, reduce the 3D eyes signal crosstalk, and simultaneously reduce the number of data driver, which is conducive to low cost.

In order to solve the technical issue, one technical solution adopted by the present invention is to provide an array substrate, comprising multiple first scanning lines, multiple second scanning lines, multiple third scanning lines, multiple data lines, multiple pixel units arranged in rows and a common electrode used to input common voltage, each pixel unit corresponding to one first scanning line, one second scanning line, one third scanning line and one data line; wherein, all the second scanning lines are electrically connected at the peripheral region of the array substrate, each pixel unit comprises a first pixel electrode, a second pixel electrode, a third pixel electrode, and a first switch, a second switch and a third switch which respectively affect the first pixel electrode, the second pixel electrode and the third pixel electrode, each pixel unit further comprises a first control circuit and a second control circuit, the data lines corresponding to the pixel units are respectively connected to the first pixel electrode, the second pixel electrode and the third pixel electrode through the first switch, the second switch and the third switch to provide data signal; the first switch, the second switch and the third switch are turned on when the first scanning line inputs a first scanning signal; wherein, the first control circuit is connected to the common electrode, the first control circuit controls the voltage difference between the first pixel electrode and the common electrode to be zero when the second scanning line inputs a second scanning signal, so that the first pixel electrode is under the state of displaying the image corresponding to the black screen, the second control circuit affects the second pixel electrode and the third pixel electrode when the third scanning line inputs a third scanning signal, which changes the voltage difference between the second pixel electrode and the third pixel electrode; wherein, in the 2D display mode, the first pixel electrode, the second pixel electrode and the third pixel electrode are under the state of displaying the image corresponding to the 2D screen under the effect of the first scanning line and the data line corresponding to the pixel unit, the first control circuit controls the first pixel electrode under the state of displaying the image corresponding to the 2D screen when the second scanning line inputs a fourth scanning signal, and then the third scanning line corresponding to the pixel unit inputs the third scanning signal to control the second control circuit to affect the second pixel unit and the third pixel electrode, the voltage difference between the second pixel electrode and the third pixel electrode is changed under the effect of the second control circuit, so that there are the voltage differences which are not zero within the first pixel electrode, the second pixel electrode and the third pixel electrode; in the 3D display mode, the second scanning line inputs the second scanning signal to control the first control circuit to affect the first pixel electrode, the second pixel electrode and the third pixel electrode are under the state of displaying the image corresponding to the 3D screen under the effect of the first scanning line and the data line corresponding to the pixel unit, the first pixel electrode is under the state of displaying the image corresponding to the black screen under the effect of the first control circuit, and then the third scanning line inputs the third scanning signal to control the second control circuit to affect the second pixel electrode and the third pixel electrode, the voltage difference between the second pixel electrode and the third pixel electrode is changed under the effect of the second control circuit, so that there is voltage difference which is not zero between the second pixel electrode and the third pixel electrode.

Wherein, the first control circuit comprises a fourth switch, the fourth switch comprises a control end, a first end and the second end, the control end of the fourth switch is connected to the second scanning line, the first end of the fourth switch is connected to the first pixel electrode, the second end of the fourth switch is connected to the common electrode, the fourth switch is turned on when the second scanning line inputs the second scanning signal, so that the first pixel electrode is electrically connected to the common electrode, the fourth switch controls the voltage difference between the first pixel electrode and the common electrode to be zero.

Wherein, the second control circuit comprises a fifth switch, a first voltage divider capacitor and a second voltage divider capacitor, the fifth switch comprises a control end, a first end and a second end, the control end of the fifth switch is connected to the third scanning line, the first end of the fifth switch is connected to one end of the first voltage divider capacitor, the other end of the first voltage divider capacitor is connected to the second pixel electrode, the second end of the fifth switch is connected to the third pixel electrode, one end of the second voltage divider capacitor is connected to one end of the first voltage divider capacitor, the other end of the second voltage divider capacitor is connected to the common electrode, the fifth switch is turned on when the third scanning line inputs the third scanning signal, so that the voltage difference between the second pixel electrode and the third pixel electrode is changed through the first voltage divider capacitor and the second voltage divider capacitor.

Wherein, the first voltage divider capacitor is made of metals which form the first scanning line and the data line, the second voltage divider capacitor is made of the metal and the transparent electrode which form the first scanning line.

In order to solve the above technical issue, another technical solution adopted by the present invention is to provide an array substrate, comprising multiple first scanning lines, multiple second scanning lines, multiple third scanning lines, multiple data lines, multiple pixel units arranged in row and a common electrode used to input common voltage, each pixel unit corresponding to one first scanning line, one second scanning line, one third scanning line and one data line; wherein, each the pixel unit comprises a first pixel electrode, a second pixel electrode, a third pixel electrode, and a first switch, a second switch and a third switch which respectively affect the first pixel electrode, the second pixel electrode and the third pixel electrode, each pixel unit further comprises a first control circuit and a second control circuit, the data lines corresponding to the pixel units are respectively connected to the first pixel electrode, the second pixel electrode and the third pixel electrode through the first switch, the second switch and the third switch to provide data signal, the first switch, the second switch and the third switch are turned on when the first scanning line inputs a first scanning signal; wherein, the first control circuit affects the first pixel electrode when the second scanning line inputs a second scanning signal, so that the first pixel electrode is under the state of displaying the image corresponding to the black screen, the second control circuit affects the second pixel electrode and the third pixel electrode when the third scanning line inputs a third scanning signal, which changes the voltage difference between the second pixel electrode and the third pixel electrode; wherein, in the 2D display mode, the first pixel electrode, the second pixel electrode and the third pixel electrode are under the state of displaying the image corresponding to the 2D screen under the effect of the first scanning line and the data line corresponding to the pixel unit, the first control circuit controls the first pixel electrode under the state of displaying the image corresponding to the 2D screen when the second scanning line inputs a fourth scanning signal, and then the third scanning line corresponding to the pixel unit inputs the third scanning signal to control the second control circuit to affect the second pixel unit and the third pixel electrode, the voltage difference between the second pixel electrode and the third pixel electrode is changed under the effect of the second control circuit, so that there are the voltage differences which are not zero within the first pixel electrode, the second pixel electrode and the third pixel electrode; in the 3D display mode, the second scanning line inputs the second scanning signal to control the first control circuit to affect the first pixel electrode, the second pixel electrode and the third pixel electrode are under the state of displaying the image corresponding to the 3D screen under the effect of the first scanning line and the data line corresponding to the pixel unit, the first pixel electrode is under the state of displaying the image corresponding to the black screen under the effect of the first control circuit, and then the third scanning line inputs the third scanning signal to control the second control circuit to affect the second pixel electrode and the third pixel electrode, the voltage difference between the second pixel electrode and the third pixel electrode is changed under the effect of the second control circuit, so that there is voltage difference which is not zero between the second pixel electrode and the third pixel electrode.

Wherein, the first control circuit is connected to the common electrode, the first control circuit controls the voltage difference between the first pixel electrode and the common electrode to be zero when the second scanning line inputs a second scanning signal, so that the first pixel electrode is under the state of displaying the image corresponding to the black screen.

Wherein, the first control circuit comprises a fourth switch, the fourth switch comprises a control end, a first end and the second end, the control end of the fourth switch is connected to the second scanning line, the first end of the fourth switch is connected to the first pixel electrode, the second end of the fourth switch is connected to the common electrode, the fourth switch is turned on when the second scanning line inputs the second scanning signal, so that the first pixel electrode is electrically connected to the common electrode, the fourth switch controls the voltage difference between the first pixel electrode and the common electrode to be zero.

Wherein, the second control circuit comprises a fifth switch, a first voltage divider capacitor and a second voltage divider capacitor, the fifth switch comprises a control end, a first end and a second end, the control end of the fifth switch is connected to the third scanning line, the first end of the fifth switch is connected to one end of the first voltage divider capacitor, the other end of the first voltage divider capacitor is connected to the second pixel electrode, the second end of the fifth switch is connected to the third pixel electrode, one end of the second voltage divider capacitor is connected to one end of the first voltage divider capacitor, the other end of the second voltage divider capacitor is connected to the common electrode, the fifth switch is turned on when the third scanning line inputs the third scanning signal, so that the voltage difference between the second pixel electrode and the third pixel electrode is changed through the first voltage divider capacitor and the second voltage divider capacitor.

Wherein, the first voltage divider capacitor is made of metals which form the first scanning line and the data line, the second voltage divider capacitor is made of the metal and the transparent electrode which form the first scanning line.

Wherein, all the second scanning lines are electrically connected at the peripheral region of the array substrate.

In order to solve the above technical issue, the other technical solution adopted by the present invention is to provide a liquid crystal display panel, comprising multiple first scanning drivers, at least one second scanning driver, multiple third scanning drivers, multiple data drivers, an array substrate, a color filter substrate and a liquid crystal layer located between the array substrate and the color filter substrate; wherein, the array substrate comprises multiple first scanning lines, multiple second scanning lines, multiple third scanning lines, multiple data lines, multiple pixel units arranged in row and a common electrode used to input common voltage, each pixel unit corresponds to one first scanning line, one second scanning line, one third scanning line and one data line; wherein, each the first scanning drivers is connected to the first scanning line to input a first scanning signal to the first scanning line, the at least one second scanning driver is connected to the second scanning line to input a second scanning signal and a fourth scanning signal to the second scanning line, each the third scanning driver is connected to the third scanning line to input a third scanning signal to the third scanning line, each the data driver is connected to one data line to input a data signal to the data line; wherein, each the pixel unit comprises a first pixel electrode, a second pixel electrode, a third pixel electrode, and a first switch, a second switch and a third switch which respectively affect the first pixel electrode, the second pixel electrode and the third pixel electrode, each pixel unit further comprises a first control circuit and a second control circuit, the data lines corresponding to the pixel units are respectively connected to the first pixel electrode, the second pixel electrode and the third pixel electrode through the first switch, the second switch and the third switch to provide data signal, the first switch, the second switch and the third switch are turned on when the first scanning line inputs the first scanning signal; the first control circuit affects the first pixel electrode when the second scanning line inputs the second scanning signal, so that the first pixel electrode is under the state of displaying the image corresponding to the black screen, the second control circuit affects the second pixel electrode and the third pixel electrode when the third scanning line inputs the third scanning signal, which changes the voltage difference between the second pixel electrode and the third pixel electrode; wherein, in the 2D display mode, the first pixel electrode, the second pixel electrode and the third pixel electrode are under the state of displaying the image corresponding to the 2D screen under the effect of the first scanning line and the data line corresponding to the pixel unit, the first control circuit controls the first pixel electrode under the state of displaying the image corresponding to the 2D screen when the second scanning line inputs the fourth scanning signal, and then the third scanning line inputs the third scanning signal to control the second control circuit to affect the second pixel unit and the third pixel electrode, the voltage difference between the second pixel electrode and the third pixel electrode is changed under the effect of the second control circuit, so that there are the voltage differences which are not zero within the first pixel electrode, the second pixel electrode and the third pixel electrode; in the 3D display mode, the second scanning line inputs the second scanning signal to control the first control circuit to affect the first pixel electrode, the second pixel electrode and the third pixel electrode are under the state of displaying the image corresponding to the 3D screen under the effect of the first scanning line and the data line corresponding to the pixel unit, the first pixel electrode is under the state of displaying the image corresponding to the black screen under the effect of the first control circuit, and then the third scanning line inputs the third scanning signal to control the second control circuit to affect the second pixel electrode and the third pixel electrode, the voltage difference between the second pixel electrode and the third pixel electrode is changed under the effect of the second control circuit, so that there is voltage difference which is not zero between the second pixel electrode and the third pixel electrode.

Wherein, the first control circuit is connected to the common electrode, the first control circuit controls the voltage difference between the first pixel electrode and the common electrode to be zero when the second scanning line inputs a second scanning signal, so that the first pixel electrode is under the state of displaying the image corresponding to the black screen.

Wherein, the first control circuit comprises a fourth switch, the fourth switch comprises a control end, a first end and the second end, the control end of the fourth switch is connected to the second scanning line, the first end of the fourth switch is connected to the first pixel electrode, the second end of the fourth switch is connected to the common electrode, the fourth switch is turned on when the second scanning line inputs the second scanning signal, so that the first pixel electrode is electrically connected to the common electrode, the fourth switch controls the voltage difference between the first pixel electrode and the common electrode to be zero.

Wherein, the second control circuit comprises a fifth switch, a first voltage divider capacitor and a second voltage divider capacitor, the fifth switch comprises a control end, a first end and a second end, the control end of the fifth switch is connected to the third scanning line, the first end of the fifth switch is connected to one end of the first voltage divider capacitor, the other end of the first voltage divider capacitor is connected to the second pixel electrode, the second end of the fifth switch is connected to the third pixel electrode, one end of the second voltage divider capacitor is connected to one end of the first voltage divider capacitor, the other end of the second voltage divider capacitor is connected to the common electrode, the fifth switch is turned on when the third scanning line inputs the third scanning signal, so that the voltage difference between the second pixel electrode and the third pixel electrode is changed through the first voltage divider capacitor and the second voltage divider capacitor.

Wherein, the first voltage divider capacitor is made of metals which form the first scanning line and the data line, the second voltage divider capacitor is made of the metal and the transparent electrode which form the first scanning line.

Wherein, all the second scanning lines re electrically connected at the peripheral region of the array substrate.

The benefits of the present invention are as follows. Differing from the situation of the prior art, in the array substrate according to the present invention, each pixel unit utilizes one first scanning line, one second scanning line, one third scanning line and one data line to drive. Comparing to the prior art, it reduces the number of data lines, and further accordingly reduces the number of data drivers, which is conducive to reduce the cost. Additionally, each pixel unit comprises a first control circuit and a second control circuit. The first control circuit affects the first pixel electrode when the second scanning line inputs the second scanning signal, so that the first pixel electrode is under the state of displaying the image corresponding to the black screen. The second control circuit affects the second pixel electrode and the third pixel electrode when the third scanning line inputs the third scanning signal, which changes the voltage difference between the second pixel electrode and the third pixel electrode. In the 2D display mode, the second scanning line controls the first control circuit, so that the first control circuit control the first pixel electrode under the state of correspondingly displaying the voltage of 2D screen, and then the first pixel electrode in the 2D display mode is under the state of displaying the image corresponding to the 2D screen. That is, the first pixel electrode, the second pixel electrode and the third pixel electrode are under the state of displaying the image corresponding to the 2D screen. Therefore, it improves the opening ratio, and the third scanning line controls the second control circuit, so that the second control circuit affects the second pixel electrode and the third pixel electrode, and there are voltage differences which are not zero within the first pixel electrode, the second pixel electrode and the third pixel electrode. Thereby, it can reduce the color difference in wide viewing angle in the 2D display mode. In the 3D display mode, the second scanning line controls the first control circuit to affect the first pixel electrode, so that the first pixel electrode is under the state of displaying the image corresponding to black screen. The first electrode under the state of displaying the image corresponding to black screen can block the wrong left-eye image and wrong right-eye image. Therefore, it can reduce the 3D eyes signal crosstalk. The third scanning line controls the second control circuit to affect the second pixel electrode and the third pixel electrode, which changes the voltage difference between the second pixel electrode and the third pixel electrode, so that there is voltage difference which is not zero between the second pixel electrode and the third pixel electrode. Thereby, it can reduce the color difference in wide viewing angle in the 3D display mode.

DETAILED DESCRIPTION OF THE PREFERRED EMBODIMENTS

The detailed descriptions accompanying drawings and the embodiment of the present invention are as follows.

Figure 1:
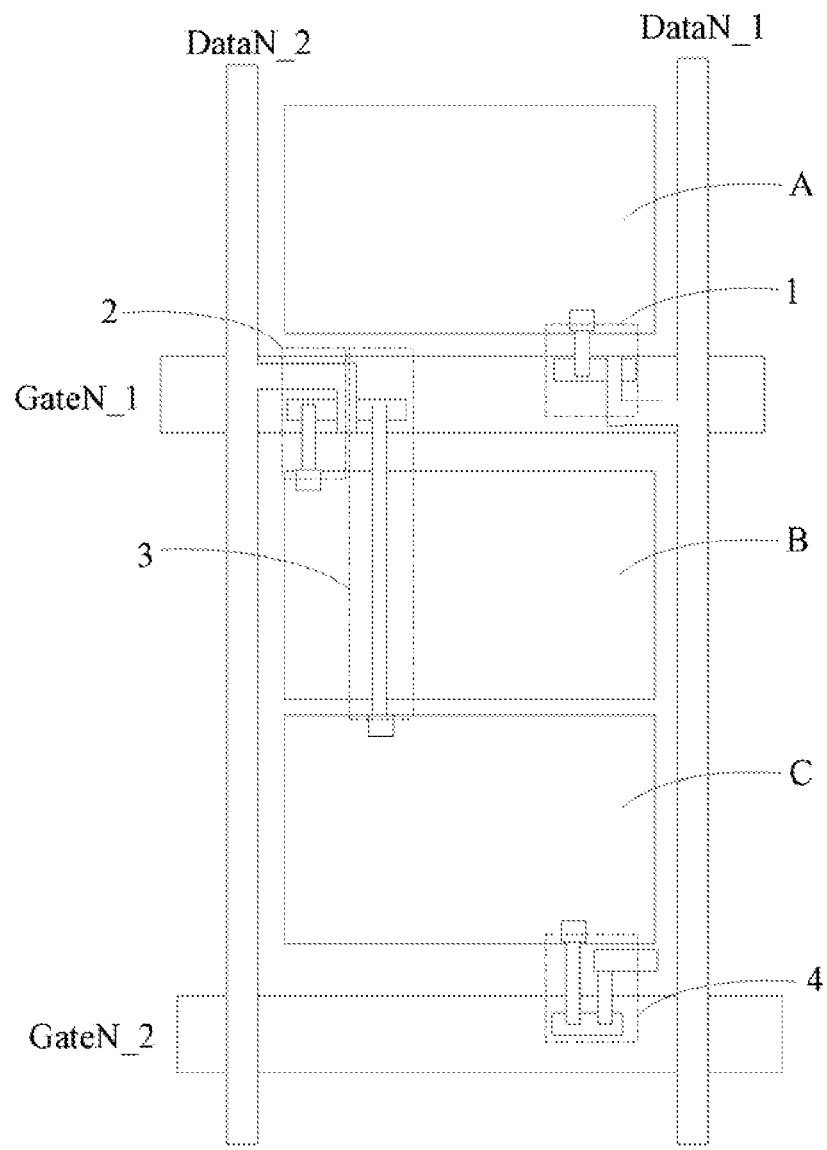
FIG. 1 is a schematic view illustrating the pixel structure of an array substrate according to the existing technology.
Figure 2:
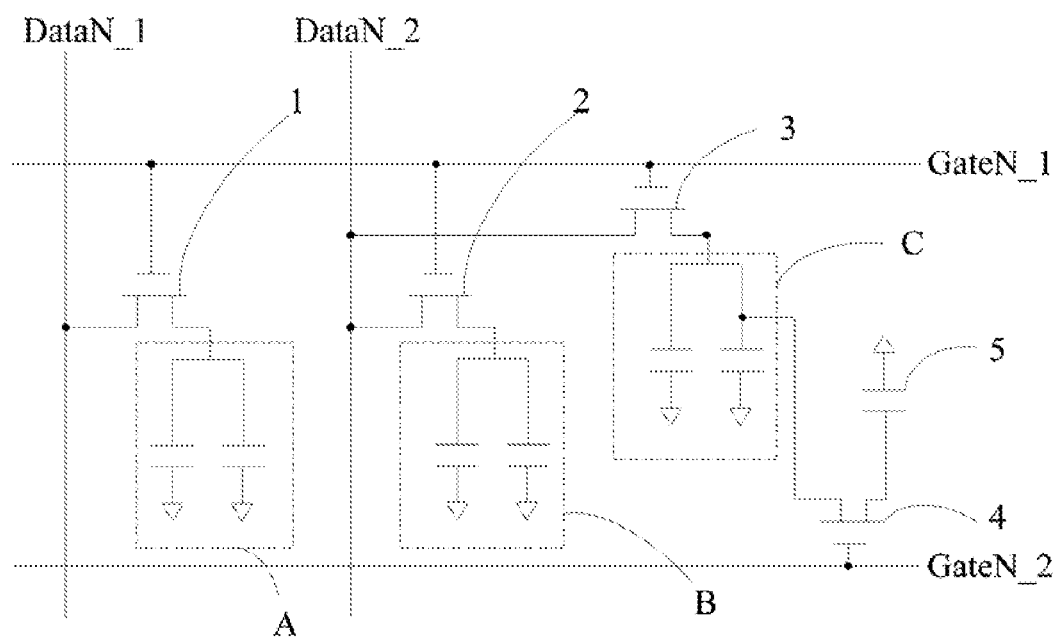
FIG. 2 is an equivalent circuit diagram of the pixel structure shown in FIG. 1.
Figure 3:
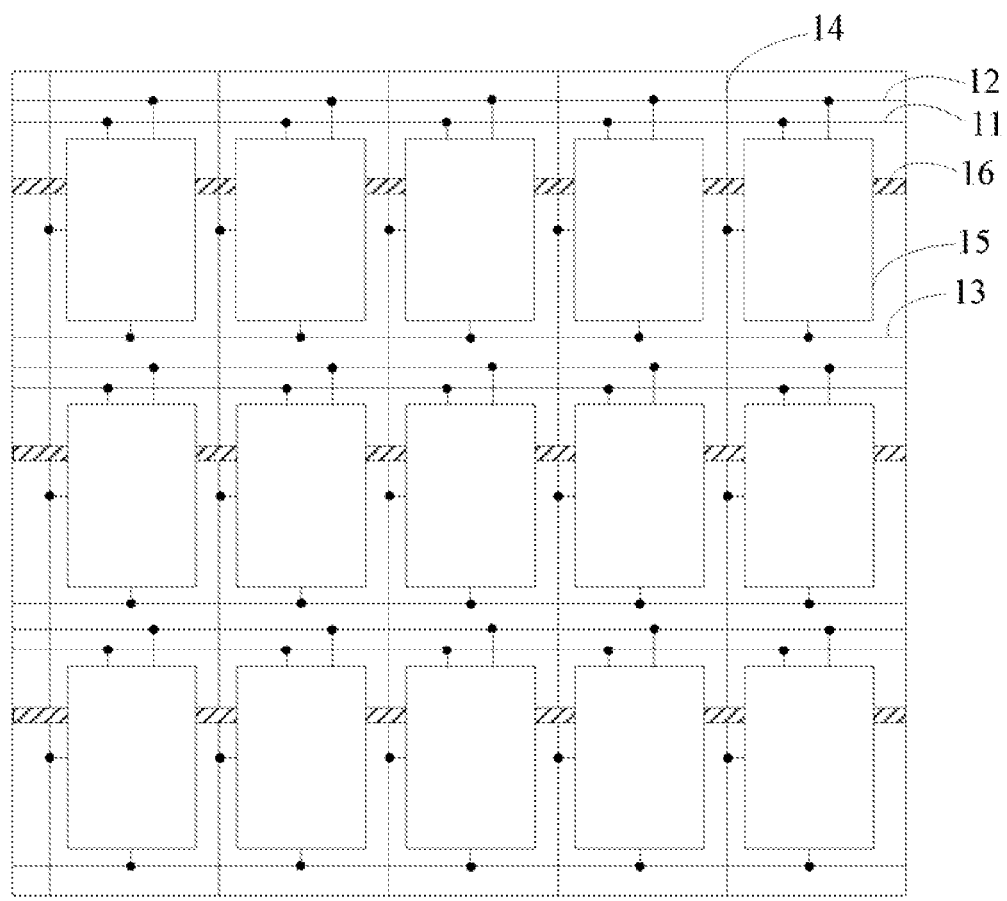
FIG. 3 is a schematic view illustrating the structure of the array substrate according to an embodiment of the present invention.
Figure 4:
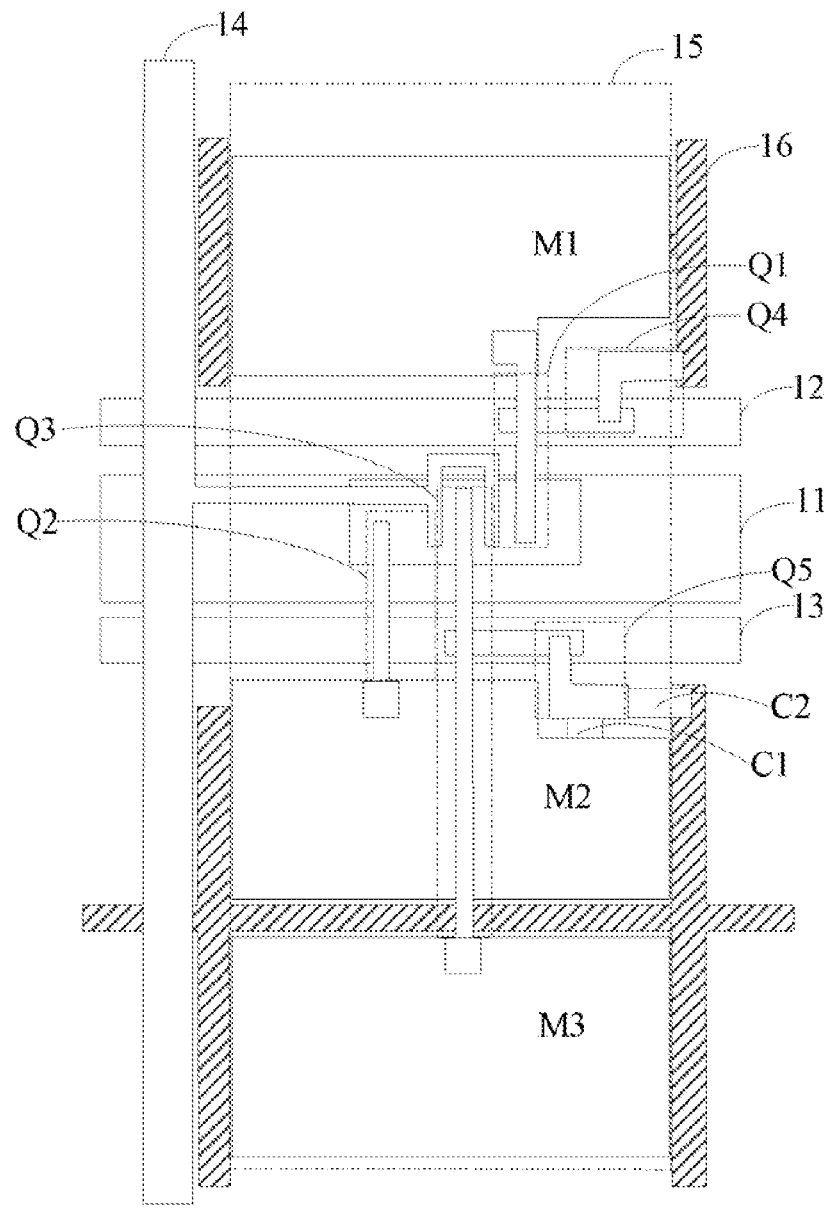
FIG. 4 is a schematic view illustrating the structure of the pixel unit according to an embodiment in the array substrate shown in FIG. 3.
Figure 5:
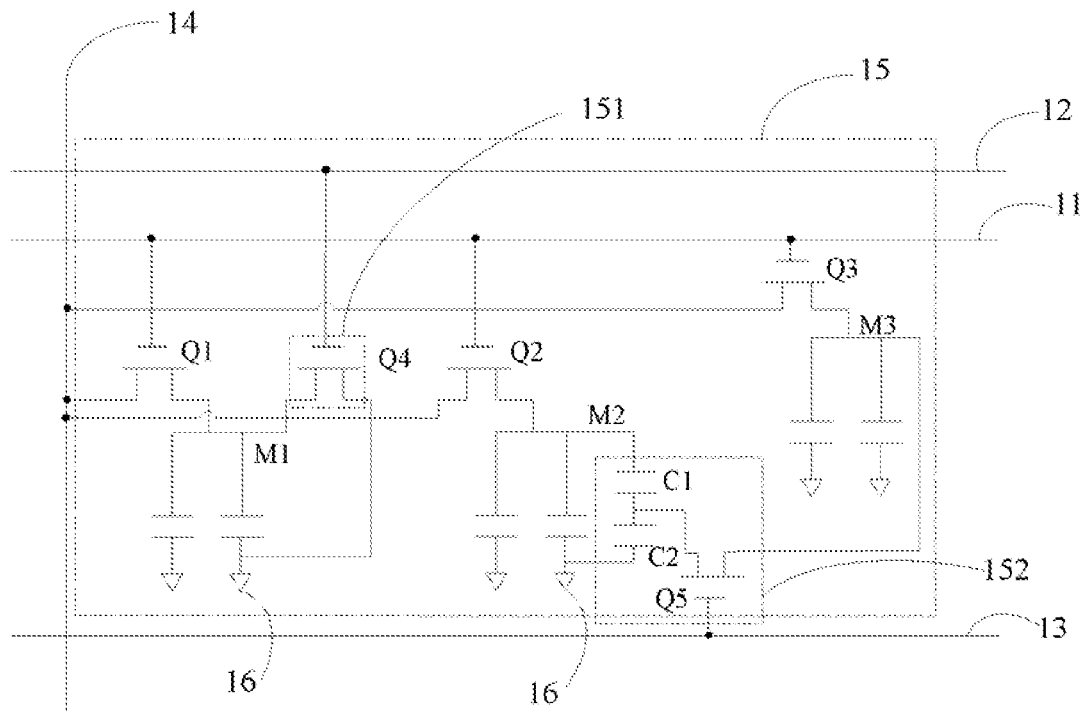
FIG. 5 is an equivalent circuit diagram of the structure of h pixel unit shown in FIG. 4.

Referring to FIGS. 3 to 5, in the array substrate according to an embodiment of the present invention, the array substrate comprises multiple first scanning lines 11, multiple second scanning lines 12, multiple third scanning lines 13, multiple data lines 14, and multiple pixel units 15 arranged in rows. The array substrate further comprises a common electrode 16 used to input common voltage. Each pixel unit 15 corresponds to one first scanning line 11, one second scanning line 12, one third scanning line 13 and one data line 14.

Wherein, referring to FIG. 5, each pixel unit 15 comprises a first pixel electrode M1, a second pixel electrode M2, a third pixel electrode M3, and a first switch Q1, a second switch Q2 and a third switch Q3 which respectively affect the first pixel electrode M1, the second pixel electrode M2 and the third pixel electrode M3. The control end of the first switch Q1, the control end of the second switch Q2 and the control end of the third switch Q3 are electrically connected with the first scanning line 11 corresponding to the pixel unit 15 to receive a first scanning signal; the input end of the first switch Q1, the input end of the second switch Q2, and the input end of the third switch Q3 are electrically connected with the data line 14 corresponding to the pixel unit 15; the output end of the first switch Q1 is electrically connected with the first pixel electrode, the output end of the second switch Q2 is electrically connected with the second pixel electrode M2, and the output end of the third switch Q3 is electrically connected with the third pixel electrode M3. The first switch Q1, the second switch Q2 and the third switch Q3 are turned on when the first scanning line 11 inputs the first scanning signal. The data lines 14 provide data signals to the first pixel electrode M1, the second pixel electrode M2 and the third pixel electrode M3 through the first switch Q1, the second switch Q2 and the third switch Q3, and then drive the first pixel electrode M1, the second pixel electrode M2 and the third pixel electrode M3. In the present embodiment, the first switch Q1, the second switch Q2 and the third switch Q3 are thin film transistor, the control end thereof corresponds to the gate of the thin film transistor, the input end thereof corresponds to the source of the thin film transistor, and the output end thereof corresponds to the drain of the thin film transistor. Of course, in the other embodiments, the first switch Q1, the second switch Q2 and the third switch Q3 can also be triode, Darlington transistor, etc., which is not limited here.

Wherein, all the second scanning lines 12 are electrically connected at the peripheral region (the area outside the pixel region) of the array substrate. Of course, in the other embodiments, all the second scanning lines 12 can be electrically connected at the inner region (the pixel region) of the array substrate, or all the second scanning lines 12 can be independent of each other, which is not limited specifically.

In the liquid crystal display technology, the display principle of the liquid crystal display panel is to have a certain voltage difference between the pixel electrode of the array substrate and the common electrode of the color filter substrate, so that the pixel electrode can normally display the corresponding images. When the voltage difference between the pixel electrode of the array substrate and the common electrode of the color filter substrate is zero, the pixel electrode displays the image corresponding to the black screen. The common voltage applied by the common electrode of the color filter substrate is the same as that applied by the common electrode of the array substrate.

In the present invention, the pixel electrode further comprises a first control circuit 151 and the second control circuit 152. The second scanning line 12 is electrically connected to the first control circuit 151 to control the first control circuit 151, and the first control circuit 151 is connected to the first pixel electrode M1 and the common electrode 16. The first control circuit 151 affects the first pixel electrode M1 when the second scanning line 12 inputs the second scanning signal, so that the voltage difference between the first pixel electrode M1 and the common electrode 16 is zero, and then the first pixel electrode is under the state of voltage corresponding to the display black screen. The third scanning line 13 is connected to the second control circuit 152 to control the second control circuit 152. The second control circuit 152 affects the second pixel electrode M2 and the third pixel electrode M3 when the third scanning line inputs the third scanning signal, which changes the voltage difference between the second pixel electrode M2 and the third pixel electrode M3.

Specifically, the first control circuit 151 comprises a fourth switch Q4. The fourth switch Q4 comprises a control end, a first end and the second end. Wherein, the control end of the fourth switch Q4 is electrically connected to the second scanning line 12, the first end of the fourth switch Q4 is electrically connected to the first pixel electrode M1, and the second end of the fourth switch Q4 is electrically connected to the common electrode 16. The fourth switch Q4 is turned on when the second scanning line 12 inputs the second scanning signal, and the fourth switch Q4 controls the voltage difference between the first pixel electrode M1 and the common electrode 16 to be zero, so that the first pixel electrode M1 is under the state of displaying the image corresponding to the black screen. The second control circuit 152 comprises a fifth switch Q5, a first voltage divider capacitor C1 and a second voltage divider capacitor C2. Wherein, the first voltage divider capacitor C1 is made of metals which form the first scanning line 11 and the data line 14, and the second voltage divider capacitor C2 is made of the metal and the transparent electrode which form the first scanning line 11. The fifth switch Q5 comprises a control end, a first end and a second end. The control end of the fifth switch Q5 is electrically connected to the third scanning line 13, the first end of the fifth switch Q5 is connected to one end of the first voltage divider capacitor C1, and the other end of the first voltage divider capacitor C1 is connected to the second pixel electrode M2. The second end of the fifth switch Q5 is connected to the third pixel electrode M3, one end of the second voltage divider capacitor C2 is connected to one end of the first voltage divider capacitor C1, and the other end of the second voltage divider capacitor C2 is connected to the common electrode. The fifth switch Q5 is turned on when the third scanning line 13 inputs the third scanning signal, the second pixel electrode M2 is connected to the third pixel electrode M3 through the first voltage divider capacitor C1 and the fifth switch Q5, and the voltages of the second pixel electrode M2 and the third pixel electrode M3 are changed, which changes the voltage difference between the second pixel electrode M2 and the third pixel electrode M3. The fourth switch Q4 and the fifth switch Q5 according to the present embodiment are thin film transistors. The control end of the fourth switch Q4 and the control end of the fifth switch Q5 are correspondingly the gate of the thin film transistor, the first end of the fourth switch Q4 and the first end of the fifth switch Q5 are correspondingly the source of the thin film transistor, and the second end of the fourth switch Q4 and the second end of the fifth switch Q5 are correspondingly the drain of the thin film transistor.

In the other embodiments, the fourth switch Q4 and the fifth switch Q5 can be triode, Darlington transistor, etc., which is not limited here.

By the above way, it can minimize the color difference in the 2D display mode and 3D in wide viewing angle, improve the opening ratio in the 2D display mode, and reduce the crosstalk of the two eyes signal in the 3D display mode.

In the 2D display mode, the common electrode 6 inputs a fixed common voltage. When scanning a row of pixel units 15, it inputs the first scanning signal to the first scanning line to turn on the first switch Q1, the second switch Q2 and the third switch Q3 firstly. The data line inputs the data signal to the first pixel electrode M1, the second pixel electrode M2 and the third pixel electrode M3 through the first switch Q1, the second switch Q2 and the third switch Q3, so that the first pixel electrode M1, the second pixel electrode M2 and the third pixel electrode M3 are under the state of displaying the image corresponding to the 2D screen. In this display mode, the second scanning line 12 inputs the fourth scanning signal with low level (−2~−12V) to turn off the fourth switch Q4. For example, it inputs the scanning signal with low level of −6V, so that the fourth switch Q4 keeps turning off under the 2D display mode, the first pixel electrode M1 is not connected with the common electrode 16, and then the first pixel electrode M1 is under the state of displaying the image corresponding to the 2D screen. That is, in the 2D display mode, the three pixel electrodes M1, M2, M3 are normally under the state of displaying the image corresponding to the 2D screen, which can improve the opening ratio in the 2D display mode.

At this time, the first pixel electrode M1, the second pixel electrode M2 and the third pixel electrode M3 have the same voltage, so that the voltage differences within the three are zero. And then, the first scanning line 11 stops inputting the scanning signal, the three switches Q1, Q2, Q3 are turned off, and the third scanning line 13 inputs the third scanning signal to turn on the fifth switch Q5. In the positive polarity (the data signal is greater than the common voltage) inversion driving period, the partial charges of the third pixel electrode M3 are transferred to the first voltage divider capacitor C1 and the second voltage divider capacitor C2 when the fifth switch Q5 is turned on, so that the voltage of the third pixel electrode M3 is decreased and the voltage of the second pixel electrode M2 is increased through the first voltage divider capacitor C1. Therefore, the voltages of the second pixel electrode M2 and the third pixel electrode M3 are changed and both voltages are different, so the voltage difference between the second pixel electrode M2 and the third pixel electrode M3 is changed, that is, the voltage difference between the both is no longer zero. In this situation, the voltage of the first pixel electrode M1 is still the same as the voltage when the data line 14 inputs the data signal, but the voltage of the second pixel electrode M2 is increased, and the voltage of the third pixel electrode M3 is decreased, so that the voltages of the first pixel electrode M1, the second pixel electrode M2 and the third pixel electrode M3 are different, and there are the voltage differences which are not zero within the first pixel electrode M1 the second pixel electrode M2 and the third pixel electrode M3. In the negative polarity (the data signal is smaller than the common voltage) inversion period, the partial charges of the first voltage divider capacitor C1 and the second voltage divider capacitor C2 are transferred to the third pixel electrode M3 when the fifth switch Q5 is turned on, so that the voltage of the third pixel electrode M3 is increased and the voltage of the second pixel electrode M2 is decreased through the first voltage divider capacitor C1. Therefore, the voltages of the second pixel electrode M2 and the third pixel electrode M3 are changed and both voltages are different, so the voltage difference between the second pixel electrode M2 and the third pixel electrode M3 is changed, that is, the voltage difference between the both is no longer zero. In this situation, the voltage of the first pixel electrode M1 is still the same as the voltage when the data line 14 inputs the data signal, but the voltage of the second pixel electrode M2 is decreased, and the voltage of the third pixel electrode M3 is increased, so that the voltages of the first pixel electrode M1, the second pixel electrode M2 and, the third pixel electrode M3 are different, and there are the voltage differences which are not zero within the first pixel electrode M1 the second pixel electrode M2 and the third pixel electrode M3. Therefore, whether it is positive polarity inversion or negative polarity inversion, the voltage differences within the first pixel electrode M1, the second pixel electrode M2 and the third pixel electrode M3 are changed under the affects of the first voltage divider capacitor C1 and the second voltage divider capacitor C2 when the fifth switch is turned on, so that the voltage differences within the three pixel electrodes M1, M2, M3 are not zero. Moreover, the voltages of the first pixel electrode M1, the second pixel electrode M2 and the third pixel electrode M3 are different, the tilt of the liquid crystal molecules in the liquid crystal region corresponding to the first pixel electrode M1, the second pixel electrode M2 and the third pixel electrode M3 is also different, which can minimize the color difference in the 2D display mode in wide viewing angle and reduce the color distortion.

In the 3D display mode, the common electrode 16 inputs the fixed common voltage, and the second scanning line 12 inputs the second scanning signal with high level (0V~33V) to turn on the fourth switch Q4. For example, it inputs the scanning signal with high level of 10V, so that the fourth switch Q4 keeps turning on under the 3D display mode. It inputs the first scanning signal to the first scanning line 11 to turn on the first to the third switch Q1, Q2, Q3, and the data line 14 respectively inputs the data signal to the first pixel electrode M1 the second pixel electrode M2 and the third pixel electrode M3 through the three switches Q1, Q2, Q3.

Because the fourth is turned on at this time, the first pixel electrode M1 is electrically connected with the common electrode 16. Due to the driving mode of positive and negative polarity inversion, there is charge transfer occurred between the first pixel electrode M1 and the common electrode 16 when electrical connection, and the voltage of the first pixel electrode M1 is close to the voltage of the common electrode 16. Specifically, when positive polarity inversion, the voltage of the first pixel electrode M1 is greater than that of the common electrode 16, so that the partial charges of the first pixel electrode M1 is transferred to the common electrode 16, the voltage of the first pixel electrode M1 is decreased and is decreased to the same as the voltage of the common electrode 16, and then the first pixel electrode M1 and the common electrode 16 achieve the charge equilibrium state. The voltage of the common electrode 16 remains unchanged, and the charges transferred from the second pixel electrode M1 are released through the common electrode 16. When negative polarity inversion, the voltage of the first pixel electrode M1 is less than that of the common electrode 16, so that the partial charges of the common electrode 16 is transferred to the first pixel electrode M1, the voltage of the first pixel electrode M1 is increased and is increased to the same as the voltage of the common electrode 16, and then the first pixel electrode M1 and the common electrode 16 achieve the charge equilibrium state. It can control the charge transferring speed between the first pixel electrode M1 and the common electrode 16 by controlling the current passing capacity as the fourth switch Q4 is turned on, so that the first pixel electrode M1 and the common electrode 16 achieve the charge equilibrium state under the control of the fourth switch Q4 in the turning-on time of the fourth switch Q4, that is, the both voltages are the same. Therefore, the voltage difference between the first pixel electrode M1 and the common electrode 16 is zero, so that the first pixel electrode M1 is under the state of the voltage corresponding to displaying the black screen, that is, the voltage of the first pixel electrode M1 is the same as that of the common electrode 16. Therefore, when the data line 14 inputs the data signal to the first pixel electrode M1, the second pixel electrode M2 and the third pixel electrode M3, the voltage of the first pixel electrode M1 is the same as that of the common electrode 16 under the turning-on of the fourth switch, so that the first pixel electrode M1 is under the state of displaying the image corresponding to the black screen, and the second pixel electrode M2 and the third pixel electrode M3 are under the state of displaying the image corresponding to the 3D screen. At this time, the second pixel electrode M2 and the third pixel electrode M3 have the same voltages.

And then, the first scanning line 11 stops inputting the first canning signal, so that the first switch Q1, the second switch Q2 and the third switch Q3 are turned off. The third scanning line 13 inputs the third scanning signal to turn on the fifth switch Q5, the voltage of the second pixel electrode M2 is increased (or decreased) through the first voltage divider capacitor C1, and the third pixel electrode M3 is decreased (or increased) through the first voltage divider capacitor C1 and the second voltage divider capacitor C2, so that the voltages of the second pixel electrode M2 and the third pixel electrode M3 are changed, and then the voltages of the second pixel electrode M2 and the third pixel electrode M3 are different. That is, there is the voltage difference which is not zero between the second pixel electrode M2 and the third pixel electrode M3, which can minimize the color difference in the 3D display mode in wide viewing angle and reduce the color distortion. The specific principle process can refer the process of 2D display mode, which is not repeated here.

Moreover, in the present embodiment, the first pixel electrode M1, the second pixel electrode M2, and the third pixel electrode M3 are sequentially arranged in the column direction. Two adjacent rows of the pixel units 15 respectively display the left-eye image and the right-eye image corresponding to the 3D screen. In the 3D display mode, the first pixel electrode M1 keeps under the state of displaying the image corresponding to the black screen through the affect of the fourth switch Q4. The first pixel electrode M1 under the state of displaying the image corresponding to the black screen is equivalent to the black matrix. Therefore, in the adjacent rows of the pixel units 15, there is a black matrix between the pixel electrode corresponding to the left-eye image (the second pixel electrode and the third pixel electrode in a row of pixel unit) and the pixel electrode corresponding to the right-eye image (the second pixel electrode and the third pixel electrode in the other row of pixel unit). The black matrix blocks the crosstalk signals of the left-eye image and the right-eye image, which can reduce the crosstalk of the two eyes signal in the 3D display mode.

Of course, in the other embodiments, the three pixel electrodes can also be arranged in the row direction. At this time, the two adjacent rows of the pixel units are respectively under the states of displaying the left-eye image and the right-eye image corresponding to the 3D picture. The first pixel electrode keeps under the state of displaying the image corresponding to the black screen, which can minimizes the crosstalk of two-eye signals in the 3D display mode. The second control circuit can also not comprise the second voltage divider capacitor, that is, the first voltage divider capacitor is not connected to the common electrode through the second voltage divider capacitor, and the first voltage divider capacitor is not connected with the common electrode. At this time, when the fifth switch is turned on, the voltage of the third pixel electrode is decreased through the second voltage divider capacitor, the voltage of the second pixel electrode is increased through the first voltage divider capacitor, and the decreased voltage of the third pixel electrode is basically the same as the increased voltage of the second pixel electrode. In this way, it can also change the voltage difference between the second pixel electrode and the third pixel electrode, so that the voltages of the three pixel electrodes are different, which can minimize the color difference in wide viewing angle and obtain the effect of low color washout.

In the above way, in the array substrate according to the present embodiment, under the affects of the first control circuit 151 and the second control circuit 152, it can increase the opening ratio in the 2D display mode, reduce the crosstalk of the two eyes signal in the 3D display mode, minimize the color difference in wide viewing angle in two display modes, and increase the wide viewing angle. Moreover, comparing with the existing technology, the present embodiment only needs one data line 14 to drive a corresponding pixel unit 15, which reduces the using amount of the data lines, and then reduces the amount of the data driver chips. For example, if the existing technology needs n data driver chips to drive, the array substrate according to the present invention only needs n/2 data driver chips. Although it will correspondingly increase the amount of the scanning driver chips when it increases one second scanning line 12 in the present embodiment, the scanning driver chip is cheaper than the data driver chip, which can effectively reduce the production costs. Furthermore, in the array substrate according to the present embodiment, all the second scanning lines 12 are electrically connected at the peripheral region of the array substrate, so that it can only need one scanning driver chip to scan the second scanning line 12, which further reduces the costs.

Moreover, in the other embodiments, the first control circuit cannot be connected with the common electrode, but be connected with the reference voltage source with a constant voltage output instead. The constant voltage output from the reference voltage source is the same as the common voltage of the common electrode. At this time, the first end of the fourth switch is connected with the first pixel electrode, and the second end is connected with the reference voltage source. There is charge transfer occurred between the first pixel electrode and the reference voltage source when the second scanning line turns on the fourth switch, so that the voltage of the first pixel electrode is the same as that of the reference voltage source, the voltage difference between the first pixel electrode and the reference voltage source is zero, and the first pixel electrode generates the voltage signal correspondingly displaying the black screen.

In the other embodiments, the first control circuit can control the data signal of the first pixel electrode to be totally released when the second scanning line inputs the second scanning signal, so that there is no data signal available for displaying on the first pixel electrode, and then the first pixel electrode is under the state of displaying the image corresponding to the black screen. For example, the first control circuit can be a switch unit. The first pixel electrode is connected to the ground through the switch unit. The first control circuit makes the first pixel electrode connected to the ground when the second scanning line inputs the second scanning signal, so that the first pixel electrode can be discharged through the ground, and the first pixel electrode is under the state of displaying the image corresponding to the black screen.

Moreover, in the above embodiment, the second control circuit utilizes two voltage divider capacitors to change the voltages of the second pixel electrode and the third pixel electrode. In the other embodiments, it can be achieved by two voltage divider resistors. That is, the second control circuit comprises a controlled switch and two voltage divider resistors connected in series. At this time, the second pixel electrode is connected with one end of the resistor string, and the other end of the resistor string is connected to the ground. One end of the controlled switch is connected between the two resistors, and the other end of the controlled switch is connected to the third pixel electrode. When the third scanning line turns on the controlled switch, the voltage of the second pixel electrode is decreased after being divided by the two voltage divider resistors, and the voltage of the third pixel electrode is decreased after being divided by the one voltage divider resistor. The voltage decreased degree of the second pixel electrode is greater than that of the third pixel electrode, so the voltages of the second pixel electrode and the third pixel electrode are decreased under the affects of the two voltage divider resistors. The different decreased degree makes the voltages of the second pixel electrode and the third pixel electrode different, so that the voltages of the three pixel electrodes are different and then achieve the effect of low color shift.

Figure 6:
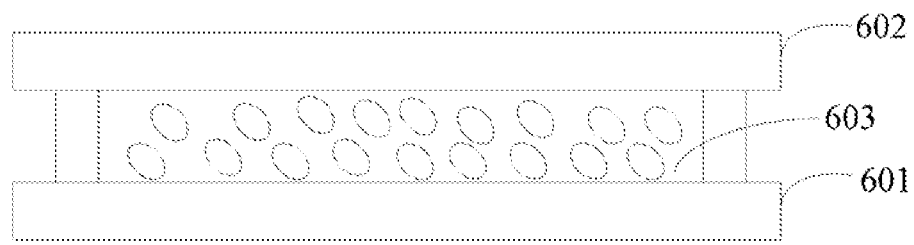
FIG. 6 is a side view illustrating the structure of the liquid crystal display panel according to an embodiment of the present invention.

Referring to FIG. 6, in the liquid crystal display panel according to an embodiment of the present invention, the liquid crystal display panel comprises an array substrate 601, a color filter substrate 602 and a liquid crystal layer 603 located between the array substrate 601 and the color filter substrate 602. Wherein, the array substrate 601 is the array substrate mentioned in FIG. 3. Moreover, the liquid crystal display panel according to the present embodiment further comprises multiple first scanning drivers 604, a second scanning driver 605, multiple third scanning drivers 606, and multiple data drivers 607. In the other embodiments, the array substrate 601 can be any array substrate according to the above embodiments.

Figure 7:
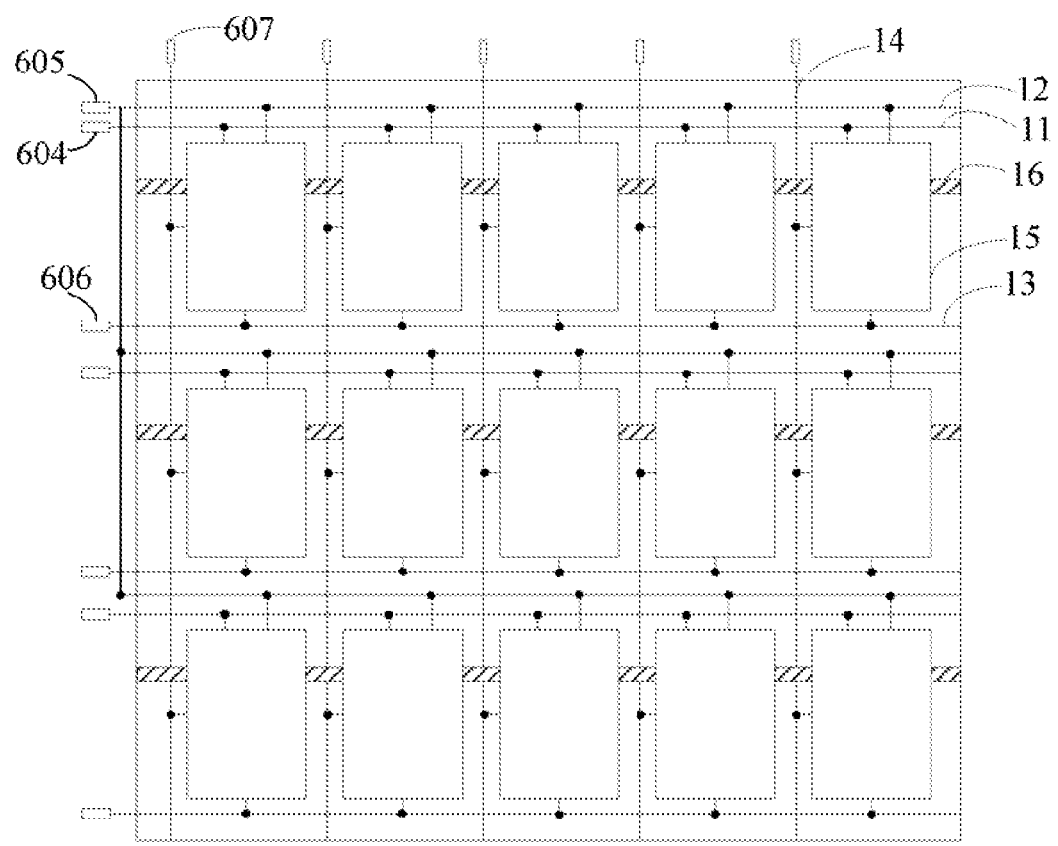
FIG. 7 is a top view illustrating the structure of the liquid crystal display panel according to an embodiment shown in FIG. 6, wherein, only the array substrate and the driver in the liquid crystal display panel are shown.

Referring to FIG. 7, FIG. 7 is a top view illustrating the structure of the liquid crystal display panel shown in FIG. 6. Wherein, each the first scanning drivers 604 is connected to the first scanning line 11 to input the first scanning signal to the first scanning line 11; the second scanning driver 605 is connected to the second scanning line 12 to input the second scanning signal and the fourth scanning signal to the second scanning line; each the third scanning driver 606 is connected to the third scanning line 13 to input the third scanning signal to the third scanning line 13; each the data driver 606 is connected to one data line 14 to input the data signal to the data line. Through the first scanning driver 604, the second scanning driver 605, the third scanning driver 606 and the data driver 607, it can together drive the liquid crystal display panel to display. The first scanning driver 604, the second scanning driver 605, the third scanning driver 606 can be selected from the scanning driver chip, which can also be selected from the scanning driving circuit constituted by discrete device. The data driver 607 can be selected from the data driver chip, which can also be selected from the data driving circuit constituted by discrete device. The liquid crystal display panel according to the present embodiment, comparing with the existing technology, can not only increase the opening ratio in the 2D display mode, reduce the crosstalk of the two eyes signal in the 3D display mode, but also minimize the color difference in wide viewing angle in two display modes, which enlarges the wide viewing angle, reduces the number of data drivers, and effectively reduces the costs.

Moreover, in the other embodiments, all the second scanning lines can be independent of each other. At this time, the liquid crystal display panel can comprises multiple second scanning drivers, and each scanning driver is connected to one second scanning line.

The preferred embodiments according to the present invention are mentioned above, which cannot be used to define the scope of the right of the present invention. Those variations of equivalent structure or equivalent process according to the present specification and the drawings or directly or indirectly applied in other areas of technology are considered encompassed in the scope of protection defined by the claims of the present invention.

What is claimed is:

1. An array substrate, comprising multiple first scanning lines, multiple second scanning lines, multiple third scanning lines, multiple data lines, multiple pixel units arranged in rows and a common electrode used to input common voltage, each pixel unit corresponding to one first scanning line, one second scanning line, one third scanning line and one data line;

wherein, all the second scanning lines are electrically connected at the peripheral region of the array substrate, each pixel unit comprises a first pixel electrode, a second pixel electrode, a third pixel electrode, and a first switch, a second switch and a third switch which respectively affect the first pixel electrode, the second pixel electrode and the third pixel electrode, each pixel unit further comprises a first control circuit and a second control circuit, the data lines corresponding to the pixel units are respectively connected to the first pixel electrode, the second pixel electrode and the third pixel electrode through the first switch, the second switch and the third switch to provide data signal; the first switch, the second switch and the third switch are turned on when the first scanning line inputs a first scanning signal;

wherein, the first control circuit is connected to the common electrode, the first control circuit controls the voltage difference between the first pixel electrode and the common electrode to be zero when the second scanning line inputs a second scanning signal, so that the first pixel electrode is under the state of displaying the image corresponding to the black screen, the second control circuit affects the second pixel electrode and the third pixel electrode when the third scanning line inputs a third scanning signal, which changes the voltage difference between the second pixel electrode and the third pixel electrode;

wherein, in the 2D display mode, the first pixel electrode, the second pixel electrode and the third pixel electrode are under the state of displaying the image corresponding to the 2D screen under the effect of the first scanning line and the data line corresponding to the pixel unit, the first control circuit controls the first pixel electrode under the state of displaying the image corresponding to the 2D screen when the second scanning line inputs a fourth scanning signal, and then the third scanning line corresponding to the pixel unit inputs the third scanning signal to control the second control circuit to affect the second pixel unit and the third pixel electrode, the voltage difference between the second pixel electrode and the third pixel electrode is changed under the effect of the second control circuit, so that there are the voltage differences which are not zero within the first pixel electrode, the second pixel electrode and the third pixel electrode; in the 3D display mode, the second scanning line inputs the second scanning signal to control the first control circuit to affect the first pixel electrode, the second pixel electrode and the third pixel electrode are under the state of displaying the image corresponding to the 3D screen under the effect of the first scanning line and the data line corresponding to the pixel unit, the first pixel electrode is under the state of displaying the image corresponding to the black screen under the effect of the first control circuit, and then the third scanning line inputs the third scanning signal to control the second control circuit to affect the second pixel electrode and the third pixel electrode, the voltage difference between the second pixel electrode and the third pixel electrode is changed under the effect of the second control circuit, so that there is voltage difference which is not zero between the second pixel electrode and the third pixel electrode.

2. The array substrate as claimed in claim 1, wherein, the first control circuit comprises a fourth switch, the fourth switch comprises a control end, a first end and the second end, the control end of the fourth switch is connected to the second scanning line, the first end of the fourth switch is connected to the first pixel electrode, the second end of the fourth switch is connected to the common electrode, the fourth switch is turned on when the second scanning line inputs the second scanning signal, so that the first pixel electrode is electrically connected to the common electrode, the fourth switch controls the voltage difference between the first pixel electrode and the common electrode to be zero.

3. The array substrate as claimed in claim 1, wherein, the second control circuit comprises a fifth switch, a first voltage divider capacitor and a second voltage divider capacitor, the fifth switch comprises a control end, a first end and a second end, the control end of the fifth switch is connected to the third scanning line, the first end of the fifth switch is connected to one end of the first voltage divider capacitor, the other end of the first voltage divider capacitor is connected to the second pixel electrode, the second end of the fifth switch is connected to the third pixel electrode, one end of the second voltage divider capacitor is connected to one end of the first voltage divider capacitor, the other end of the second voltage divider capacitor is connected to the common electrode, the fifth switch is turned on when the third scanning line inputs the third scanning signal, so that the voltage difference between the second pixel electrode and the third pixel electrode is changed through the first voltage divider capacitor and the second voltage divider capacitor.

4. The array substrate as claimed in claim 3, wherein, the first voltage divider capacitor is made of metals which form the first scanning line and the data line, the second voltage divider capacitor is made of the metal and the transparent electrode which form the first scanning line.

5. An array substrate, comprising multiple first scanning lines, multiple second scanning lines, multiple third scanning lines, multiple data lines, multiple pixel units arranged in row and a common electrode used to input common voltage, each pixel unit corresponding to one first scanning line, one second scanning line, one third scanning line and one data line;

wherein, each the pixel unit comprises a first pixel electrode, a second pixel electrode, a third pixel electrode, and a first switch, a second switch and a third switch which respectively affect the first pixel electrode, the second pixel electrode and the third pixel electrode, each pixel unit further comprises a first control circuit and a second control circuit, the data lines corresponding to the pixel units are respectively connected to the first pixel electrode, the second pixel electrode and the third pixel electrode through the first switch, the second switch and the third switch to provide data signal, the first switch, the second switch and the third switch are turned on when the first scanning line inputs a first scanning signal;

wherein, the first control circuit affects the first pixel electrode when the second scanning line inputs a second scanning signal, so that the first pixel electrode is under the state of displaying the image corresponding to the black screen, the second control circuit affects the second pixel electrode and the third pixel electrode when the third scanning line inputs a third scanning signal, which changes the voltage difference between the second pixel electrode and the third pixel electrode;

wherein, in the 2D display mode, the first pixel electrode, the second pixel electrode and the third pixel electrode are under the state of displaying the image corresponding to the 2D screen under the effect of the first scanning line and the data line corresponding to the pixel unit, the first control circuit controls the first pixel electrode under the state of displaying the image corresponding to the 2D screen when the second scanning line inputs a fourth scanning signal, and then the third scanning line corresponding to the pixel unit inputs the third scanning signal to control the second control circuit to affect the second pixel unit and the third pixel electrode, the voltage difference between the second pixel electrode and the third pixel electrode is changed under the effect of the second control circuit, so that there are the voltage differences which are not zero within the first pixel electrode, the second pixel electrode and the third pixel electrode; in the 3D display mode, the second scanning line inputs the second scanning signal to control the first control circuit to affect the first pixel electrode, the second pixel electrode and the third pixel electrode are under the state of displaying the image corresponding to the 3D screen under the effect of the first scanning line and the data line corresponding to the pixel unit, the first pixel electrode is under the state of displaying the image corresponding to the black screen under the effect of the first control circuit, and then the third scanning line inputs the third scanning signal to control the second control circuit to affect the second pixel electrode and the third pixel electrode, the voltage difference between the second pixel electrode and the third pixel electrode is changed under the effect of the second control circuit, so that there is voltage difference which is not zero between the second pixel electrode and the third pixel electrode.

6. The array substrate as claimed in claim 5, wherein, the first control circuit is connected to the common electrode, the first control circuit controls the voltage difference between the first pixel electrode and the common electrode to be zero when the second scanning line inputs a second scanning signal, so that the first pixel electrode is under the state of displaying the image corresponding to the black screen.

7. The array substrate as claimed in claim 6, wherein, the first control circuit comprises a fourth switch, the fourth switch comprises a control end, a first end and the second end, the control end of the fourth switch is connected to the second scanning line, the first end of the fourth switch is connected to the first pixel electrode, the second end, of the fourth switch is connected to the common electrode, the fourth switch is turned on when the second scanning line inputs the second scanning signal, so that the first pixel electrode is electrically connected to the common electrode, the fourth switch controls the voltage difference between the first pixel electrode and the common electrode to be zero.

8. The array substrate as claimed in claim 5, wherein, the second control circuit comprises a fifth switch, a first voltage divider capacitor and a second voltage divider capacitor, the fifth switch comprises a control end, a first end and a second end, the control end of the fifth switch is connected to the third scanning line, the first end of the fifth switch is connected to one end of the first voltage divider capacitor, the other end of the first voltage divider capacitor is connected to the second pixel electrode, the second end of the fifth switch is connected to the third pixel electrode, one end of the second voltage divider capacitor is connected to one end of the first voltage divider capacitor, the other end of the second voltage divider capacitor is connected to the common electrode, the fifth switch is turned on when the third scanning line inputs the third scanning signal, so that the voltage difference between the second pixel electrode and the third pixel electrode is changed through the first voltage divider capacitor and the second voltage divider capacitor.

9. The array substrate as claimed in claim 8, wherein, the first voltage divider capacitor is made of metals which form the first scanning line and the data line, the second voltage divider capacitor is made of the metal and the transparent electrode which form the first scanning line.

10. The array substrate as claimed in claim 5, wherein, all the second scanning lines are electrically connected at the peripheral region of the array substrate.

11. A liquid crystal display panel, comprising multiple first scanning drivers, at least one second scanning driver, multiple third scanning drivers, multiple data drivers, an array substrate, a color filter substrate and a liquid crystal layer located between the array substrate and the color filter substrate;

wherein, the array substrate comprises multiple first scanning lines, multiple second scanning lines, multiple third scanning lines, multiple data lines, multiple pixel units arranged in row and a common electrode used to input common voltage, each pixel unit corresponds to one first scanning line, one second scanning line, one third scanning line and one data line;

wherein, each the first scanning drivers is connected to the first scanning line to input a first scanning signal to the first scanning line, the at least one second scanning driver is connected to the second scanning line to input a second scanning signal and a fourth scanning signal to the second scanning line, each the third scanning driver is connected to the third scanning line to input a third scanning signal to the third scanning line, each the data driver is connected to one data line to input a data signal to the data line;

wherein, each the pixel unit comprises a first pixel electrode, a second pixel electrode, a third pixel electrode, and a first switch, a second switch and a third switch which respectively affect the first pixel electrode, the second pixel electrode and the third pixel electrode, each pixel unit further comprises a first control circuit and a second control circuit, the data lines corresponding to the pixel units are respectively connected to the first pixel electrode, the second pixel electrode and the third pixel electrode through the first switch, the second switch and the third switch to provide data signal, the first switch, the second switch and the third switch are turned on when the first scanning line inputs the first scanning signal;

the first control circuit affects the first pixel electrode when the second scanning line inputs the second scanning signal, so that the first pixel electrode is under the state of displaying the image corresponding to the black screen, the second control circuit affects the second pixel electrode and the third pixel electrode when the third scanning line inputs the third scanning signal, which changes the voltage difference between the second pixel electrode and the third pixel electrode;

wherein, in the 2D display mode, the first pixel electrode, the second pixel electrode and the third pixel electrode are under the state of displaying the image corresponding to the 2D screen under the effect of the first scanning line and the data line corresponding to the pixel unit, the first control circuit controls the first pixel electrode under the state of displaying the image corresponding to the 2D screen when the second scanning line inputs the fourth scanning signal, and then the third scanning line inputs the third scanning signal to control the second control circuit to affect the second pixel unit and the third pixel electrode, the voltage difference between the second pixel electrode and the third pixel electrode is changed under the effect of the second control circuit, so that there are the voltage differences which are not zero within the first pixel electrode, the second pixel electrode and the third pixel electrode; in the 3D display mode, the second scanning line inputs the second scanning signal to control the first control circuit to affect the first pixel electrode, the second pixel electrode and the third pixel electrode are under the state of displaying the image corresponding to the 3D screen under the effect of the first scanning line and the data line corresponding to the pixel unit, the first pixel electrode is under the state of displaying the image corresponding to the black screen under the effect of the first control circuit, and then the third scanning line inputs the third scanning signal to control the second control circuit to affect the second pixel electrode and the third pixel electrode, the voltage difference between the second pixel electrode and the third pixel electrode is changed under the effect of the second control circuit, so that there is voltage difference which is not zero between the second pixel electrode and the third pixel electrode.

12. The liquid crystal display panel as claimed in claim 11, wherein, the first control circuit is connected to the common electrode, the first control circuit controls the voltage difference between the first pixel electrode and the common electrode to be zero when the second scanning line inputs a second scanning signal, so that the first pixel electrode is under the state of displaying the image corresponding to the black screen.

13. The liquid crystal display panel as claimed in claim 12, wherein, the first control circuit comprises a fourth switch, the fourth switch comprises a control end, a first end and the second end, the control end of the fourth switch is connected to the second scanning line, the first end of the fourth switch is connected to the first pixel electrode, the second end of the fourth switch is connected to the common electrode, the fourth switch is turned on when the second scanning line inputs the second scanning signal, so that the first pixel electrode is electrically connected to the common electrode, the fourth switch controls the voltage difference between the first pixel electrode and the common electrode to be zero.

14. The liquid crystal display panel as claimed in claim 11, wherein, the second control circuit comprises a fifth switch, a first voltage divider capacitor and a second voltage divider capacitor, the fifth switch comprises a control end, a first end and a second end, the control end of the fifth switch is connected to the third scanning line, the first end of the fifth switch is connected to one end of the first voltage divider capacitor, the other end of the first voltage divider capacitor is connected to the second pixel electrode, the second end of the fifth switch is connected to the third pixel electrode, one end of the second voltage divider capacitor is connected to one end of the first voltage divider capacitor, the other end of the second voltage divider capacitor is connected to the common electrode, the fifth switch is turned on when the third scanning line inputs the third scanning signal, so that the voltage difference between the second pixel electrode and the third pixel electrode is changed through the first voltage divider capacitor and the second voltage divider capacitor.

15. The liquid crystal display panel as claimed in claim 14, wherein, the first voltage divider capacitor is made of metals which form the first scanning line and the data line, the second voltage divider capacitor is made of the metal and the transparent electrode which form the first scanning line.

16. The liquid crystal display panel as claimed in claim 11, wherein, all the second scanning lines are electrically connected at the peripheral region of the array substrate.

* * * * *